United States Patent
Huang et al.

(10) Patent No.: US 11,437,708 B2
(45) Date of Patent: Sep. 6, 2022

(54) ANTENNA EFFECT PROTECTION AND ELECTROSTATIC DISCHARGE PROTECTION FOR THREE-DIMENSIONAL INTEGRATED CIRCUIT

(71) Applicant: Taiwan Semiconductor Manufacturing Company, Ltd., Hsinchu (TW)

(72) Inventors: Po-Hsiang Huang, Tainan (TW); Fong-Yuan Chang, Hsinchu County (TW); Tsui-Ping Wang, Zhubei (TW); Yi-Shin Chu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/149,853

(22) Filed: Jan. 15, 2021

(65) Prior Publication Data

US 2021/0305678 A1    Sep. 30, 2021

Related U.S. Application Data

(60) Provisional application No. 63/002,737, filed on Mar. 31, 2020.

(51) Int. Cl.
| | |
|---|---|
| *H01Q 1/22* | (2006.01) |
| *H01L 23/66* | (2006.01) |
| *H01Q 23/00* | (2006.01) |
| *H01Q 1/50* | (2006.01) |

(52) U.S. Cl.
CPC ........... *H01Q 1/2283* (2013.01); *H01L 23/66* (2013.01); *H01Q 1/50* (2013.01); *H01Q 23/00* (2013.01)

(58) Field of Classification Search
CPC ........ H01Q 1/2283; H01Q 1/50; H01Q 23/00; H01L 23/66
USPC ...................................... 343/700 R
See application file for complete search history.

(56) References Cited

U.S. PATENT DOCUMENTS

| | | | |
|---|---|---|---|
| 10,510,629 B2 | 12/2019 | Chen et al. | |
| 2014/0098448 A1* | 4/2014 | Henderson | H01L 23/5256 361/56 |
| 2019/0371763 A1 | 12/2019 | Agarwal et al. | |
| 2020/0020610 A1* | 1/2020 | Lim | H01L 21/76831 |
| 2021/0082873 A1* | 3/2021 | Chen | H01L 23/5226 |

FOREIGN PATENT DOCUMENTS

| | | |
|---|---|---|
| KR | 10-2012-0089691 A | 8/2012 |
| TW | I681466 B | 1/2020 |
| WO | 2011/049585 A1 | 4/2011 |

* cited by examiner

*Primary Examiner* — Peguy Jean Pierre
(74) *Attorney, Agent, or Firm* — Merchant & Gould P.C.

(57) ABSTRACT

A 3D IC package is provided. The 3D IC package includes: a first IC die comprising a first substrate at a back side of the first IC die; a second IC die stacked at the back side of the first IC die and facing the first substrate; a TSV through the first substrate and electrically connecting the first IC die and the second IC die, the TSV having a TSV cell including a TSV cell boundary surrounding the TSV; and a protection module fabricated in the first substrate, wherein the protection module is electrically connected to the TSV, and the protection module is within the TSV cell.

20 Claims, 10 Drawing Sheets

ANTENNA EFFECT PROTECTION AND ELECTROSTATIC DISCHARGE PROTECTION FOR THREE-DIMENSIONAL INTEGRATED CIRCUIT

PRIORITY CLAIM AND CROSS-REFERENCE

This application claims priority to U.S. Provisional Application No. 63/002,737, filed Mar. 31, 2020, the disclosure of which is hereby incorporated by reference in its entirety

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with lower power consumption, better performance, smaller chip areas, and lower costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC layout is generated after numerous steps of an IC design, also called a "data preparation stage," and a series of checks in a process, called "physical verification," at the end. Examples of common checks in this verification process are design rule checking (DRC), layout versus schematic (LVS), parasitic extraction, antenna rule checking which will be discussed in detail below, and electrical rule checking (ERC). When all verification is complete, the data in the IC layout is translated into an industry standard format, typically a vector-based format, such as GDSII or OASIS, and sent to a semiconductor foundry, called a fab house. The foundry then converts, via mask data preparation (MDP) procedure, the data into a set of instructions by which a photomask writer can generate a physical mask (a photomask) to be used in a photolithographic process of semiconductor device fabrication. More recent MDP procedures require the additional steps associated with design for manufacturability such as, resolution enhancement technologies (RET) and optical proximity correction (OPC). By using a series of photomasks, in addition to other processes, a wafer having one or more die (chips) is fabricated.

The antenna effect, more formally plasma induced gate oxide damage, is an effect that can potentially cause yield and reliability problems during the manufacture of integrated circuits. In the manufacturing of an integrated circuit (IC) using Metal-Oxide-Semiconductor (MOS) technology, processes involving charged ions are typically employed, such as a plasma etching process and an ion implantation process. As an example, during a plasma etching process used in forming gate polysilicon (poly) patterns or interconnect metal line patterns, electrostatic charges may accumulate on a floating gate poly electrode. The resulting voltage on the gate poly electrode may become so large that charges may flow into the gate oxide, become trapped in the gate oxide or flow through the gate oxide. These charges may significantly degrade the gate oxide strength and cause MOS device reliability failures.

Each poly gate region collects an electrostatic charge proportional to its own area. A small gate oxide region connected to a large poly geometry or a large interconnect metal geometry through poly contacts can accumulate a disproportionate amount of charges (positive plasma ions in the case of a grounded or a negative biased wafer) and may suffer serious damage. This mechanism is commonly known as the antenna effect because the large poly or interconnect metal area act as an antenna to collect the electrostatic charges that flow through the vulnerable gate oxide. The strength of the antenna effect is proportional to the ratio between the exposed conductor area and the gate oxide area.

Foundries normally supply antenna rules, which are rules that are provided to avoid the antenna effect. A violation of the antenna rules is called an antenna violation. When there is any antenna rule violation, IC designers take measures to fix the antenna rule violation.

Additionally, on-chip electrostatic discharge (ESD) is typically provided. On-chip ESD protection mechanisms generally work in two ways. First, by dissipating the ESD current transient safely using a low-impedance discharging channel that prevents thermal damages in the structures of the IC. Secondly, by clamping any ESD induced voltage to a safe level to avoid dielectric degradation or rupture. Ideally the complete ESD protection solution may be realized on the IC creating an effective discharging channel from any pin to every other pin on the IC.

A three-dimensional integrated circuit (3D IC) is an IC manufactured by stacking silicon wafers or dies and interconnecting them vertically using, for instance, through-substrate vias (TSVs), hybrid boding (HB), or Cu-Cu connections, so that they behave as a single device to achieve performance improvements at reduced power and smaller footprint than conventional two dimensional processes. The 3D IC is one of several 3D integration schemes that exploit the vertical direction (i.e., a Z-direction) to achieve electrical performance benefits, in microelectronics and nanoelectronics. In a 3D IC chip, the antenna effect is specifically referred to the package antenna effect. The package antenna effect is caused by ploy gate breakage due to charges generated during etching of a TSV and a HB structure.

In accordance with embodiments of the disclosure, as a 3D IC may generally have TSVs and HB structures, and an antenna diode is placed in the TSV cell (i.e., within a "keep-out" zone where no active semiconductor devices are placed as discussed further below) or a HB region, rather than being associated with any specific functional cell. The centralized approach (i.e., one antenna diode in the TSV cell or the HB region that protects many transistors in neighboring functional cells) is more effective in terms of chip area, IC speed, and power consumption. Placing the antenna diode inside the TSV cell takes advantage of the chip area inside the TSV cell, which otherwise cannot be utilized for placing any active semiconductor devices. In addition to adding an antenna diode in the TSV cell or the HB region, the gate structure of a transistor in the neighboring function cells may have an enlarged poly area to provide further antenna effect protection for this specific transistor. These technologies are applicable to ESD protection as well.

Figure 1:
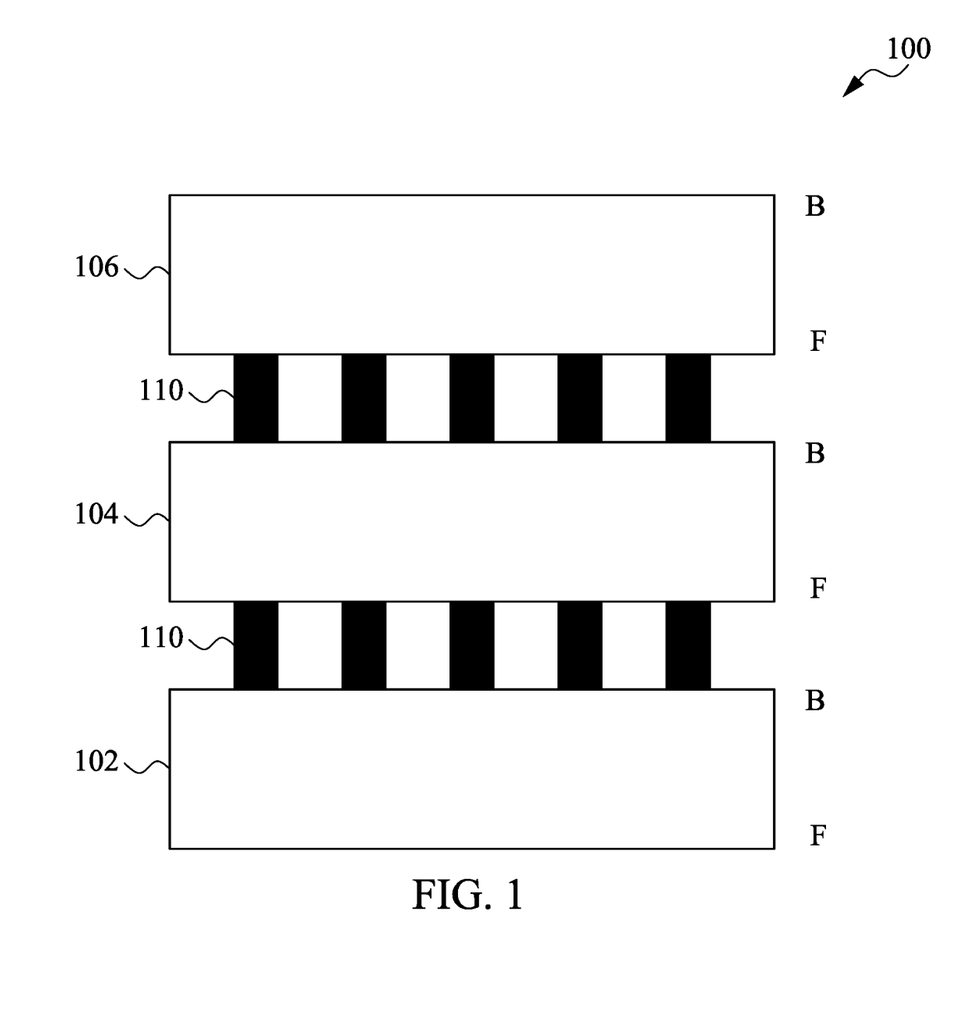
FIG. 1 is a schematic diagram illustrating a 3D IC package in accordance with some embodiments.

FIG. 1 is a schematic diagram illustrating a 3D IC package 100 in accordance with some embodiments. In the example shown in FIG. 1, the 3D IC package 100 includes three stacked IC dies 102, 104, and 106, though any desired number (e.g., four, six, nine, and so on) of stacked IC dies are within the scope of the disclosure. A variety of IC die types may be included, depending intended functions performed by the 3D IC package 100. For example, the 3D IC package 100 may be the main processor of a laptop computer, a tablet computer, a smart phone, an audio/video player, a cellular phone, a video game console, a television, a radio, or other electronic device. In some embodiments, two of the IC dies (e.g., the IC dies 102 and 104) are similarly configured, so that one of the two IC dies (e.g., the IC die 102) can be substituted for the other (e.g., the IC die 104) in the event of a failure, and the failed IC die (e.g., the IC die 104) can be bypassed.

In some embodiments, the 3D IC package 100 is a complete system in package (SiP), in which the IC die 102 is a general purpose processor, and the IC dies 104 and 106 may be any combination of dynamic random access memory (DRAM), a graphics processor, an audio/video processor, a digital radio receiver, a flash memory (or other solid state memory), a communications processor (which may include a WiFi (802.11) interface, a global positioning satellite (GPS) receiver, a Bluetooth interface, a second processor, a power management unit or other communications interface used by the 3D IC package 100. These IC die types are only listed as examples and are not exclusive of other types of IC dies.

In some embodiments, the 3D IC package 100 may be optionally mounted to a semiconductor interposer (e.g., a silicon interposer) not shown, in a 2.5D IC configuration. The interposer has one or more additional IC dies mounted horizontally from the 3D IC package 100. In one non-limiting example, one of the additional IC dies is the main system processor, another one of the additional IC dies is a system bus, and the IC dies 102, 104, and 106 are three DRAM dies.

Each of the three stacked IC dies 102, 104, and 106 has a front side (F) and a back side (B). In the example shown in FIG. 1, the back side of the IC die 102 is facing the front side of the IC die 104; the back side of the IC die 104 is facing the front side of the front side of the IC die 106. The IC dies 102, 104, and 106 are connected to each other by interconnect structures 110, such as through substrate vias (TSVs) (also referred to as through-silicon vias in the case where the IC dies are fabricated on a silicon substrate), metal patterns, conductive vias, redistribution layer, hybrid bonding (HB) structures or the like. The discussion herein applies to IC dies fabricated on any type of semiconductor substrate such as silicon substrates and silicon on insulator (SOI) substrates. Although FIG. 1 only shows five interconnect structures 110 between the IC dies 102 and 104 as well as between the IC dies 104 and 106, this is just for illustrative purpose. Any desired number of interconnect structures 110 may be provided.

Figure 2:
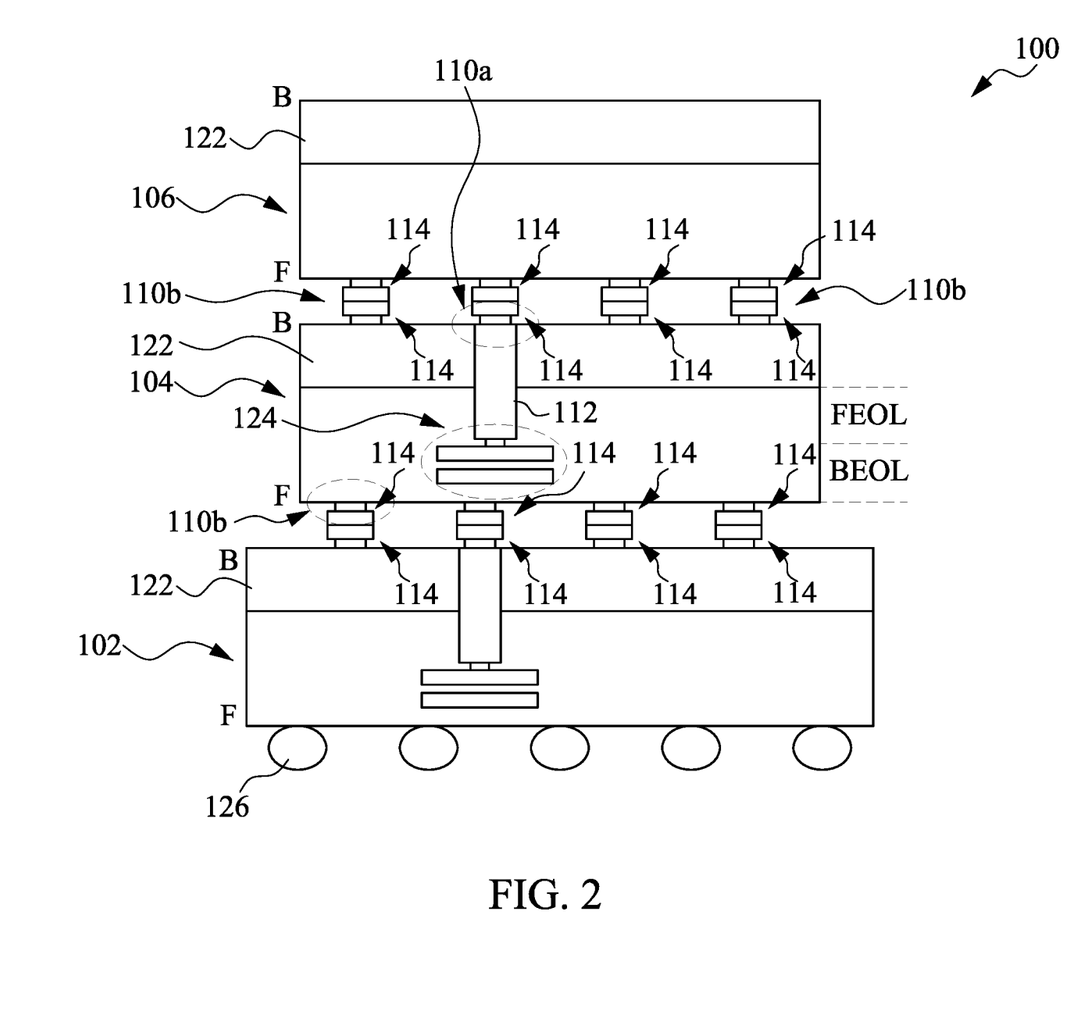
FIG. 2 is a cross-sectional diagram of an example 3D IC package of FIG. 1 in accordance with some embodiments.

FIG. 2 is a cross-sectional diagram of an example 3D IC package 100 of FIG. 1 in accordance with some embodiments. In the example shown in FIG. 2, each of the IC dies 102, 104, and 106 has a substrate 122, front-end-of-line (FEOL) structures such as transistors not shown, and back-end-of-line (BEOL) structures including a multi-layer interconnect (MLI) structure 124. The MLI structure 124 includes, among other things, multiple metal layers and vias connecting those multiple metal layers. In one non-limiting example, the MLI structure 124 includes the first metal (M1) layer, the second metal (M2) layer, the third metal (M3) layer, the fourth metal (M4) layer, the fifth metal (M5) layer all the way up to the twelfth metal (M12) layer. Complicated routing of the IC die 104 may be achieved by the MLI structure 124. Solder bumps 126 at the front side of the IC die 102 can be used to bond the 3D IC package 100 with other structures such as a semiconductor interposer as mentioned above. Since the IC die 104 is interfacing, at both the front side and the back side, with the IC die 102 and the IC die 106, respectively, only the IC die 104 is discussed in detail below for simplicity.

In the example shown in FIG. 2, there are two categories of the interconnect structures 110, namely the interconnect structures 110a and the interconnect structures 110b. The interconnect structure 110a includes a TSV 112 and an HB structure 114. The TSV 112 is through the substrate 122 and connected between the MLI structure 124 and the HB structure 114. The HB structure 114 includes two layers: a hybrid bonding contact structure and a hybrid bonding metal layer, which will be described below in detail with reference to FIG. 8. The HB structure 114 is also used for, together with other HB structures 114, bonding of the IC dies 104 and 106. Specifically, the HB structure 114 interfaces with another HB structure 114 on the other side (i.e., protruding from the IC die 106) to form an HB structure pair, and the hybrid bonding metal layers of this HB structure pair are bonded together. As such, the IC dies 104 and 106 are bonded and electrically connected through the TSV 112 and the HB structure 114, at the back side of the IC die 104. Details of the interconnect structure 110a will be discussed in detail below with reference to FIGS. 3-6.

On the other hand, at the front side of the IC die 104, the interconnect structure 110b includes another HB structure 114 (e.g., the leftmost between the IC dies 104 and 102, shown in FIG. 2). The HB structure 114 is similarly used for, together with other HB structures 114, bonding of the IC dies 104 and 102. Specifically, the HB structure 114 interfaces with another HB structure 114 on the other side (i.e., protruding from the IC die 102) to form an HB structure pair, and the hybrid bonding metal layers of this HB structure pair are bonded together. As such, the IC dies 104 and 102 are bonded. Details of the interconnect structure 110b will be discussed in detail below with reference to FIGS. 8-9.

Figure 3:
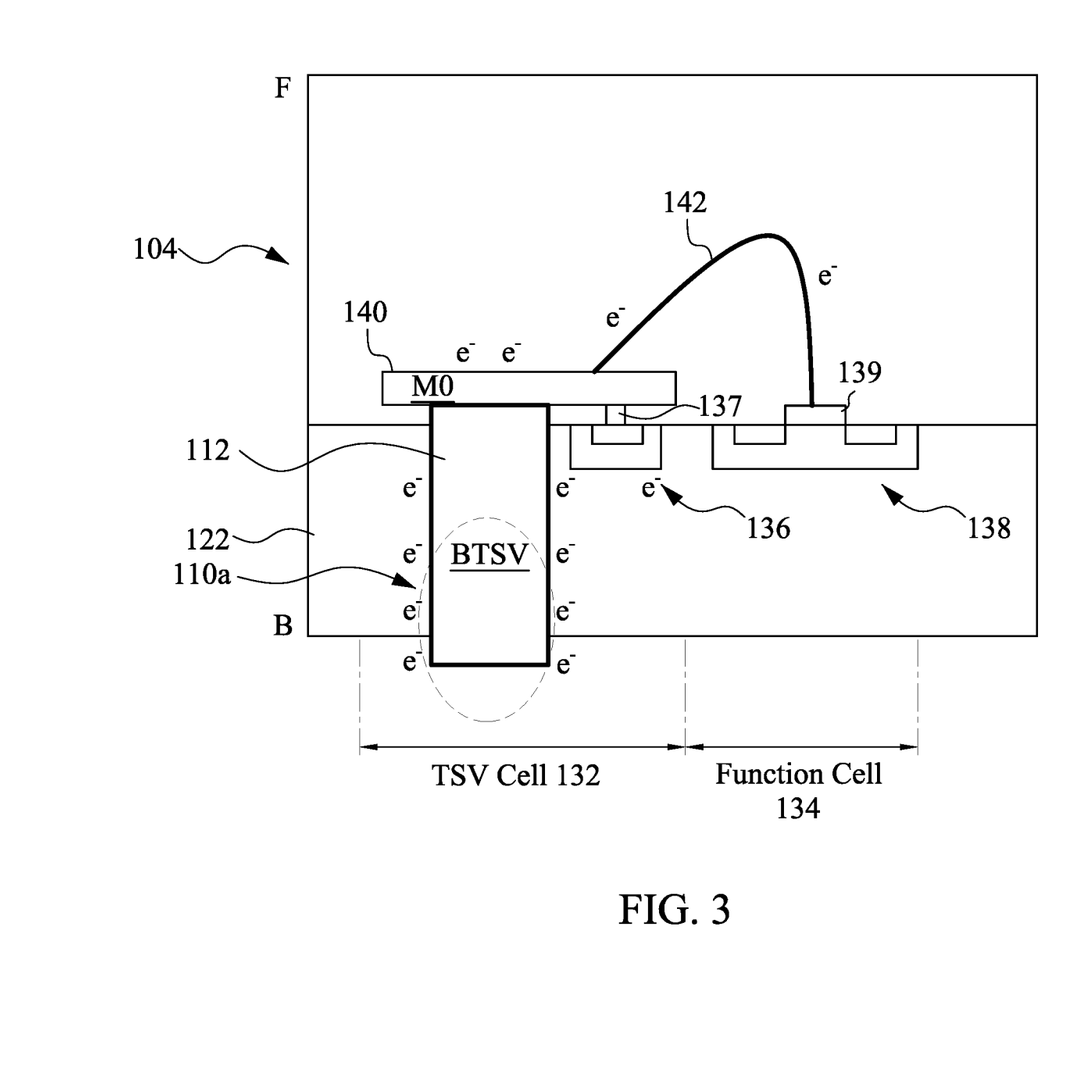
FIG. 3 is a cross-sectional diagram of a TSV cell at the back side of the IC die of FIG. 2 in accordance with some embodiments.
Figure 4:
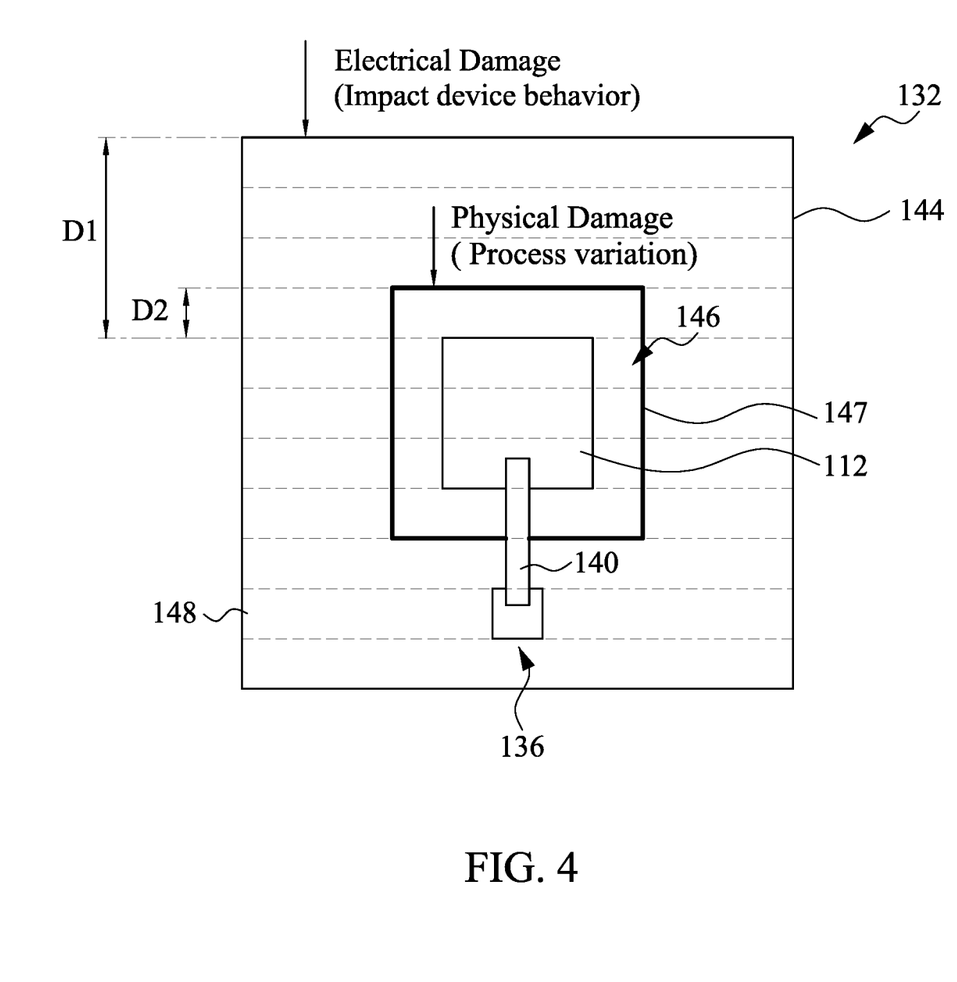
FIG. 4 is a diagram illustrating the TSV cell of FIG. 3 in accordance with some embodiments.
Figure 5:
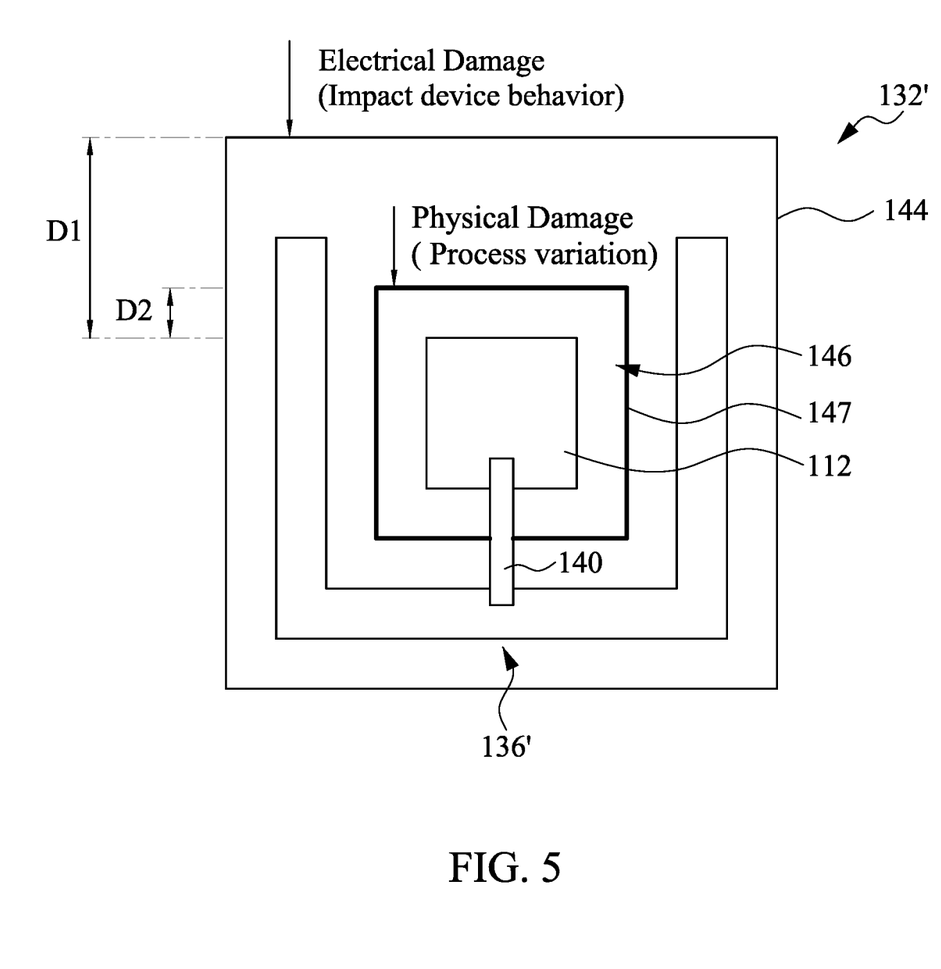
FIG. 5 is a diagram illustrating another TSV cell in accordance with some embodiments.

FIG. 3 is a cross-sectional diagram of a TSV cell 132 at the back side of the IC die 104 of FIG. 2 in accordance with some embodiments. FIG. 4 is a diagram illustrating the TSV cell 132 of FIG. 3 in accordance with some embodiments. FIG. 5 is a diagram illustrating a layout of the TSV cell 132 of FIG. 3 in accordance with some embodiments. In general, an antenna diode 136 is placed in the TSV cell 132 for antenna effect protection of the IC die 104. Unlike in some 2D ICs, the antenna diode 136 is not placed in any functional cell and is not associated with any specific transistors in the IC die 104. Instead, the antenna diode 136 is placed in the TSV cell 132. It should be noted that the antenna diode 136 is one non-limiting example of an antenna protection module. Other suitable antenna protection modules are within the scope of the disclosure.

In the example shown in FIG. 3, the interconnect structure 110a includes, among other things, a (backside) TSV 112 at the back side of the IC die 104. The TSV 112 is located in a TSV cell 132. A functional cell 134 is next to the TSV cell 132. The functional cell 134 may be a standard cell chosen from a cell library in the IC design stage. In the non-limiting example shown in FIG. 3, a transistor 138 is located in the functional cell 134, though other components not shown may also be located in the functional cell 134. One end of the TSV 112 is connected to a metal pattern 140 in the zero metal (M0) layer. It should be noted that this is just one example, and the TSV 112 may be connected to other metal patterns in other layers (e.g., a metal pattern in the M1 layer). In one non-limiting example, the TSV 112 includes a liner not shown, a diffusion barrier layer not shown, and a conductive material not shown, subsequently from outside to inside. In one embodiment, the TSV structure 112 is formed by the following operations. Firstly, a TSV opening is formed extending to the metal pattern 140 in the M0 layer by one or more etching processes. After the TSV opening is formed, the liner is formed on sidewalls of the TSV opening to act as an isolation layer, such that the conductive material of the TSV structure 112 and the substrate 122 do not directly contact with each other. Afterwards, the diffusion barrier layer is conformally formed on the liner and on the bottom of the TSV opening. The diffusion barrier layer is used to prevent the conductive material, which will be formed later, from migrating to undesired regions. After the diffusion barrier layer is formed, the conductive material is used to fill into the TSV opening. Afterwards, excess liner, diffusion barrier layer, and conductive material, which are on the outside of the TSV opening, are removed by a planarization process, such as a chemical mechanical polishing (CMP) process, although any suitable removal process may be used.

However, during the fabrication of the TSV 112, charges are generated in etch processes. Those charges (schematically shown as "e" in FIG. 3) may flow to and accumulate on the gate 139 of the transistor 138 in the functional cell 134. Specifically, in this example, the electrical path through which the charges flow is from the TSV 112, via the metal pattern 140 and a schematic electrical path 142, to the gate structure 139 of the transistor 138. The schematic electrical path 142 represents an electrical path in other metal layers such as the M1 layer and the M2 layer. As a result, the voltage on the poly electrode of the gate structure 139 may become so large that charges may flow into the gate oxide of the gate structure 139, become trapped in the gate oxide or flow through the gate oxide. These charges may significantly degrade the gate oxide strength and cause MOS device reliability failures, as mentioned above.

In a 2D IC package, an antenna diode may be placed in the specific functional cell (e.g., the functional cell 134) where an antenna effect exists or an antenna rule is violated. The antenna diode creates another electrical path to discharge the charges. However, placing an antenna diode in the specific functional cell is remedial (i.e., only after identifying the antenna effect), and sometimes there is not enough chip area in the specific functional cell to accommodate the antenna diode. Alternatively, it is possible to place an antenna diode in every functional cell to solve the problem in advance. However, the extra capacitance of the antenna diodes may make the 2D IC slower and more power hungry. It should be noted that an antenna capacitor may function in the same manner as the antenna diode in terms of antenna effect protection.

In contrast, in the 3D IC (e.g., the 3D IC package 100 shown in FIG. 1 and FIG. 2), TSVs (e.g., the TSV 112) are generally used. The antenna diode 136 is not associated with any specific functional cell (e.g., the functional cell 134). Instead, the antenna diode 136 is placed in the TSV cell 132. The centralized approach (i.e., one antenna diode in the TSV cell that protects many transistors in neighboring functional cells) is more effective in terms of chip area, IC speed, and power consumption. Specifically, in the example of FIG. 3, an antenna diode 136 is placed in the TSV cell 132. The antenna diode 136 is connected with the TSV 112 through a via 137 and the metal pattern 140 in the M0 layer, though other connection means (e.g. through metal patterns in other metal layers) are also within the scope of the disclosure.

In one embodiment, in addition to adding the antenna diode 136 in the TSV cell 132, the gate structure 139 of the transistor 138 has an enlarged poly area. This can be achieved by for example connecting multiple transistors in parallel. When the transistor 138 is a FinFET, this can also be achieved by for example using multiple fin (e.g., two-fin, three-fin, five-fin, and so on) structures for one FinFET. The enlarged poly area can provide further antenna effect protection to a specific transistor in a specific functional cell.

Referring to FIG. 4, the TSV cell 132 has a TSV cell boundary 144. The TSV 112 is located in the middle of the TSV cell 132. The TSV cell 132 is also referred to as a keep-out zone (KOZ) 132, because no active semiconductor devices (i.e., transistors that are used to transmit/process signals) are allowed to be placed in the keep-out zone 132, to avoid interference (e.g., TSV-induced stress) between the TSV 112 and the active semiconductor devices inside the keep-out zone 132. In other words, if any active semiconductor device is placed inside the keep-out zone 132, the behavior of the active semiconductor device may be negatively impacted, and electrical damages may occur. Keep-out zone 132 is a conservative way to prevent any active semiconductor devices from being impacted by the interference. It should be noted that the TSV cell 132 and the keep-out zone 132 are used interchangeably in the disclosure.

However, as the antenna diode 136 is a passive semiconductor device (i.e., a transistor not used to transmit/process signals), the antenna diode 136 is allowed to be placed in the keep-out zone 132 (i.e., inside the TSV cell boundary 144).

On the other hand, placing the antenna diode too close to the TSV 112 is avoided, because process variations may result a closer distance between the TSV 112 and the antenna diode 136 than expected. The closer distance may lead to physical damages. Therefore, the antenna diode 136 should be placed outside a TSV buffer zone 146 having a TSV buffer zone boundary 147.

In summary, the antenna diode 136, or generally an antenna protection module, is placed in the TSV cell 132, and more specifically inside the TSV cell boundary 144 while outside the TSV buffer zone 146. The size of the TSV cell 132 is generally larger than the size of the functional cell 134. Placing the antenna diode 136 inside the TSV cell 132 (i.e., the keep-out zone 132) takes advantage of the chip area inside the TSV cell 132, which otherwise cannot be utilized for placing any active semiconductor devices.

As shown in FIG. 4, the distance between the TSV 112 and the TSV cell boundary 144 is D1, whereas the distance between the TSV 112 and the TSV buffer zone boundary 147 is D2. In one non-limiting example, D1 is 5 µm, whereas D2 is 3 µm. In another non-limiting example, D1 is 3 µm, whereas D2 is 1 µm. It should be noted that the shapes and the dimensional sizes shown in FIG. 4 are only for illustration. Other shapes and dimensional sizes are within the scope of the disclosure.

The TSV cell 132 can be divided into multiple rows for layout design purposes. In one embodiment, the antenna diode 136 is placed "on row," meaning that the antenna diode 136 is placed on one row 148 as shown in FIG. 4. Placing the antenna diode 136 on row may be compatible with certain layout rules.

FIG. 5 is a diagram illustrating another TSV cell 132' in accordance with some embodiments. As mentioned above, on-chip ESD protection is provided in disclosed embodiments to protect the IC device. On-chip ESD protection mechanisms generally work in two ways. In general, by placing an ESD protection module 136' inside the TSV cell 132', the ESD current is dissipated safely through a low-impedance discharging channel that prevents thermal damages in the structures of the IC.

FIG. 5 is similar to FIG. 4, except that the ESD protection module 136' is different from the antenna diode 136 of FIG. 4. Devices that may be used as the ESD protection module 136' include diodes, bipolar transistors, MOSFETs and silicon-controlled rectifiers (SCRs), among others. The ESD protection module 136' is generally larger than the antenna diode 136 of FIG. 4, as the ESD current is generally larger than that of an antenna effect. In the non-limiting example shown in FIG. 5, the ESD protection module 136' includes multiple diodes connected in parallel to handle the relatively large ESD current.

Again, the ESD protection module 136' is placed inside the keep-out zone 132' (i.e., the TSV cell 132', used interchangeably in this disclosure) while outside the TSV buffer zone 146, in the same manner as in FIG. 4. The ESD protection module 136' can be placed inside the keep-out zone 132' because it is not an active semiconductor device. Other details are not repeated for simplicity as FIG. 5 is similar to FIG. 4.

It should be noted that the antenna protection module (e.g., the antenna diode 136) and the ESD protection module 136' can generally be referred to as a protection module.

Figure 6:
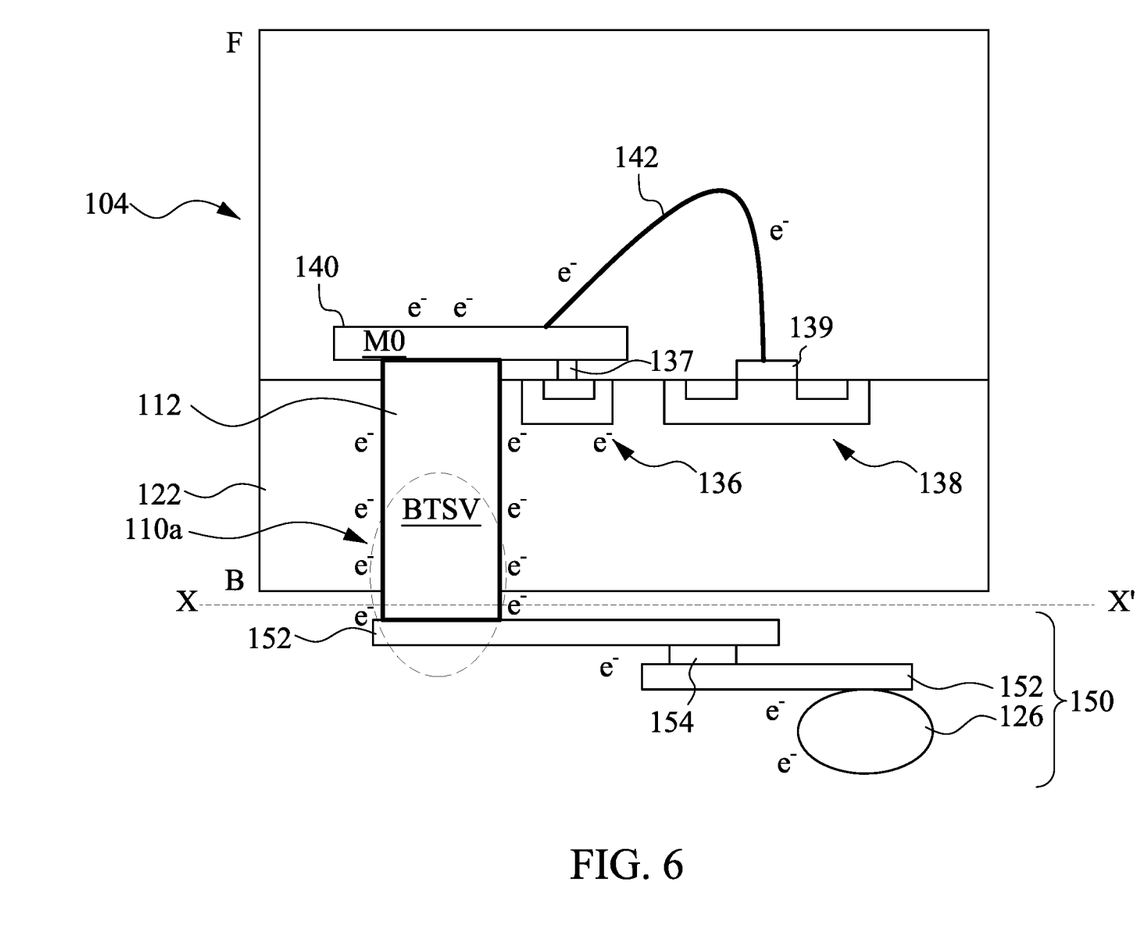
FIG. 6 is a cross-sectional diagram illustrating the TSV cell of FIG. 3 with backside routing in accordance with some embodiments.
Figure 7:
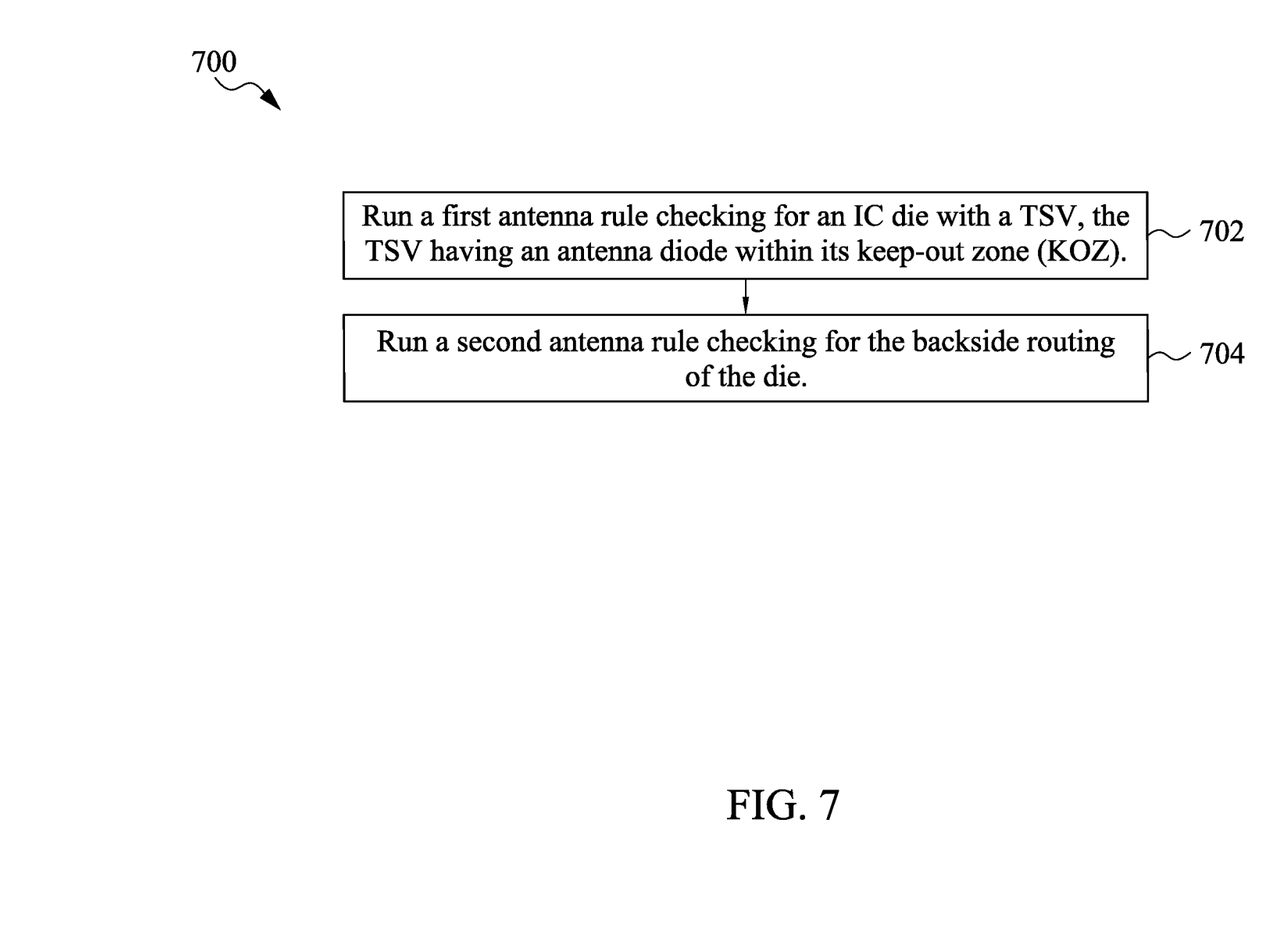
FIG. 7 is a flowchart illustrating a method of antenna rule checking in accordance with some embodiments.

FIG. 6 is a cross-sectional diagram illustrating the TSV cell 132 of FIG. 3 with backside routing 150 in accordance with some embodiments. FIG. 7 is a flowchart illustrating a method 700 of antenna rule checking in accordance with some embodiments. The portion above the dash line X-X' is the same as that in FIG. 3, whereas the portion below the dash line X-X' is the backside routing 150. In the non-limiting example shown in FIG. 6, the backside routing 150 includes, among other things, two metal patterns in two metal layers 152, a via 154 connected therebetween, and a solder bump 126. Charges generated during the fabrication of the backside routing 150 may flow to and accumulate at the gate structure 139 of the transistor 138 as well. Therefore, the antenna rule checking method 700 is needed to address the IC die 104 having the TSV 112.

As shown in FIG. 7, the method 700 generally includes two steps. At step 702, a first antenna rule checking is run for the IC die 104 with a (backside) TSV 112. The TSV 112 has the antenna diode 136 placed inside the keep-out zone 132 (i.e., the TSV cell 132) of the TSV 112. In one embodiment, poly area parameters and junction area parameters may be generated for a specific port step 702, which may be utilized later. At step 704, a second antenna rule checking is run for the backside routing 150 shown in FIG. 6. In one embodiment, the poly area parameters and the junction area parameters generated earlier may be used for the second antenna rule checking. As such, the antenna rule checking method 700 can address potential antenna rule violation on both sides (i.e., above and below the line X-X' shown in FIG. 6).

Figure 8:
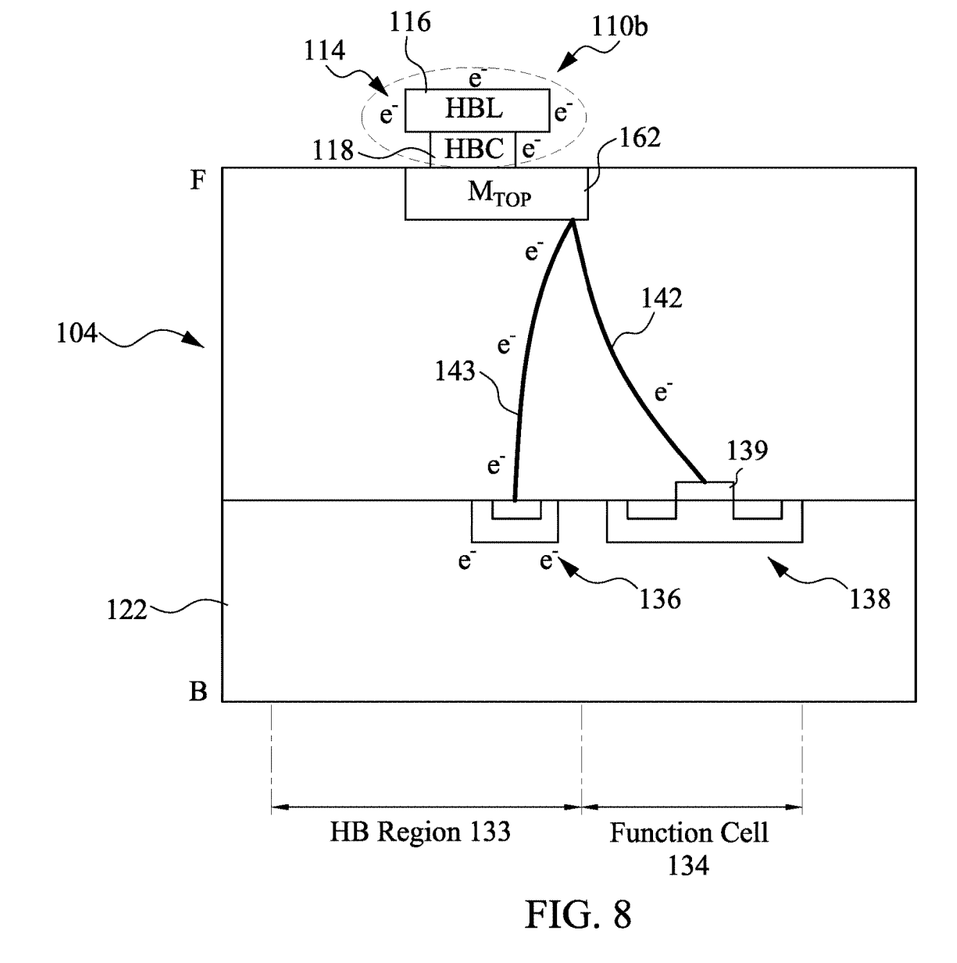
FIG. 8 is a cross-sectional diagram of a HB region at the front side of the IC die of FIG. 2 in accordance with some embodiments.
Figure 9:
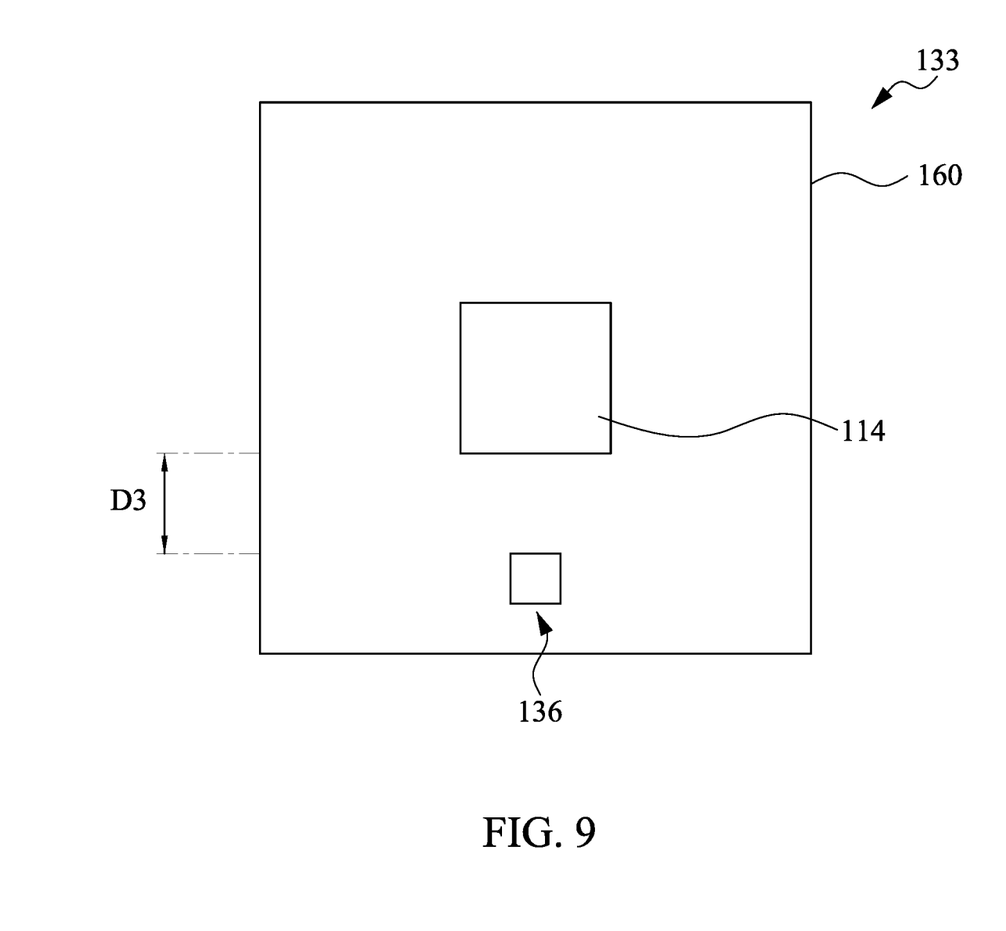
FIG. 9 is a diagram illustrating the HB region of FIG. 8 in accordance with some embodiments.

FIG. 8 is a cross-sectional diagram of a HB region 133 at the front side of the IC die 104 of FIG. 2 in accordance with some embodiments. FIG. 9 is a diagram illustrating the HB region 133 of FIG. 8 in accordance with some embodiments. In general, an antenna diode 136 is placed in the HB region 133 (i.e., a region surrounding the HB structure 114) for antenna effect protection of the IC die 104. Unlike in 2D IC, the antenna diode 136 is not placed in any functional cell and is not associated with any specific transistors in the IC die 104. Instead, the antenna diode 136 is placed in the HB region 133.

Hybrid bonding (HB) is a technology that may be used for wafer-to-wafer, die-to-wafer, and die-to-die interconnection. In hybrid bonding, two structures are bonded together using different materials with a wafer bonder. Specifically, two dies/wafers are bonded together using a combination of two technologies, namely a dielectric-to-dielectric bond and a metal-to-metal bond, often at room temperature. In one embodiment, the dielectric-to-dielectric bond is followed by the metal-to-metal bond. In one embodiment, the metal-to-metal bond is a copper-to-copper bond. Hybrid bonding enables 250,000 to 1 million interconnect structures per square millimeter, much more than other technologies such as micro-bumps do.

In the example shown in FIG. 8, the interconnect structure 110b includes, among other things, a HB structure 114 at the front side of the IC die 104. The HB structure 114 is located in a HB region (i.e., a HB cell, used interchangeably in this disclosure) 133. A functional cell 134 is next to the HB region 133. The functional cell 134 may be a standard cell chosen from a cell library in the IC design stage. In the non-limiting example shown in FIG. 8, a transistor 138 is located in the functional cell 134, though other components not shown may also be located in the functional cell 134.

The HB structure 114 includes, among other things, a hybrid bonding metal layer 116 and a hybrid bonding contact structure 118 below the hybrid bonding metal layer 116. The hybrid bonding contact structure 188 is a via in one embodiment. The hybrid bonding contact structure 188 is connected to a metal pattern 162 in the top metal layer of an MLI structure not shown. In a non-limiting example shown in FIG. 8, the top metal layer is the twelfth metal (M12) layer.

However, during the fabrication of the HB structure 114, charges are generated in etch processes. Those charges (schematically shown as "e' in FIG. 8) may flow to and accumulate on the gate structure 139 of the transistor 138 in the functional cell 134. Specifically, in this example, the electrical path through which the charges flow is from the HB structure 114, via the metal pattern 162 and a schematic electrical path 142, to the gate structure 139 of the transistor 138. The schematic electrical path 142 represents an electrical path in other metal layers such as all metal layers between the M1 layer to the M12 layer. As a result, the voltage on the poly electrode of the gate structure 139 may become so large that charges may flow into the gate oxide of the gate structure 139, become trapped in the gate oxide or flow through the gate oxide. These charges may significantly degrade the gate oxide strength and cause MOS device reliability failures, as mentioned above.

Again, unlike in 2D IC where an antenna diode may be placed in the specific functional cell (e.g., the functional cell 134) where an antenna effect exists or an antenna rule is violated, in the 3D IC (e.g., the 3D IC package 100 shown in FIG. 1 and FIG. 2), the antenna diode 136 is not associated with any specific functional cell (e.g., the functional cell 134). Instead, the antenna diode 136 is placed in the HB region 133. The centralized approach (i.e., one antenna diode in the HB region that protects many transistors in neighboring functional cells) is more effective in terms of chip area, IC speed, and power consumption. Specifically, in the example of FIG. 8, an antenna diode 136 is placed in the HB region 133. The antenna diode 136 is connected with the HB structure 114 through a schematic electrical path 143 similar to the schematic electrical path 142.

In one embodiment, in addition to adding the antenna diode 136 in the HB region 133, the gate structure 139 of the transistor 138 has an enlarged poly area. This can be achieved by for example connecting multiple transistors in parallel. When the transistor 138 is a FinFET, this can also be achieved by for example using multiple fin (e.g., two-fin, three-fin, five-fin, and so on) structures for one FinFET. The enlarged poly area can provide further antenna effect protection to a specific transistor in a specific functional cell.

Referring to FIG. 9, the HB region 133 has a HB region boundary 160. The HB structure 114 is located in the middle of the HB region 133. Unlike the TSV cell 132 as shown in FIG. 4, the HB region does not have a keep-out zone (KOZ) and does not have a buffer zone, because the HB structure 114 is on the top of the front side of the IC die 104. The antenna diode 136 is allowed to be placed anywhere in the HB region 133. In some embodiments, the antenna diode 136 does not overlap with the HB structure 114. In other embodiments, the antenna diode 136 may overlap with the HB structure 114. In a non-limiting example, the distance D3 between the HB structure 114 and the antenna diode 136 is three contacted poly pitches (CPP). In another non-limiting example, the distance D3 between the HB structure 114 and the antenna diode 136 is two contacted poly pitches (CPP). In yet another non-limiting example, the distance D3 between the HB structure 114 and the antenna diode 136 is one contacted poly pitch (CPP). It should be noted that the shapes and the dimensional sizes shown in FIG. 9 are only for illustration. Other shapes and dimensional sizes are within the scope of the disclosure.

Similarly, the HB region 133 can be divided into multiple rows for layout design purposes. In one embodiment, the antenna diode 136 is placed "on row," meaning that the antenna diode 136 is placed on one row not shown. Placing the antenna diode 136 on row may be compatible with certain layout rules.

Similarly, an ESD protection module may be placed in the HB region 133 in the same manner shown in FIG. 5. For simplicity, details of placing an ESD protection module in the HB region 133 are not discussed in detail.

Figure 10:
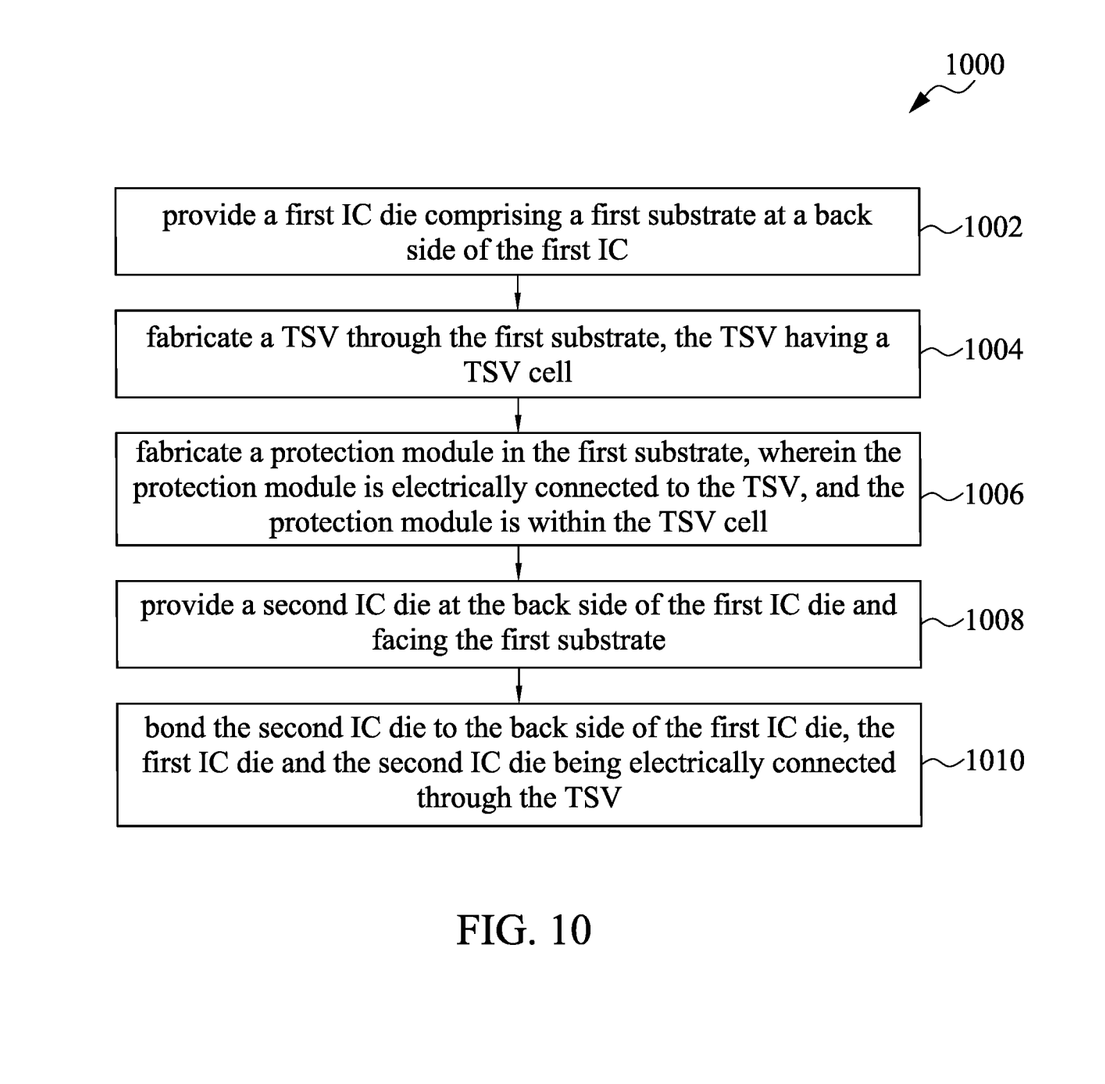
FIG. 10 is a flowchart illustration a method 1000 for fabricating a 3D IC package in accordance with some embodiments.

FIG. 10 is a flowchart illustration a method 1000 for fabricating a 3D IC package in accordance with some embodiments. As shown in FIG. 10, the method 1000 starts at step 1002. At step 1002, a first IC die (e.g., the IC die 104 shown in FIG. 2) is provided. The first IC die has a first substrate (i.e., the substrate 122 shown in FIG. 2) at a back side of the first IC die. At step 1004, a TSV (e.g., the TSV 112 shown in FIG. 3) is fabricated through the first substrate. The TSV has a TSV cell (e.g., the TSV cell 132 shown in FIG. 3). In one embodiment, the TSV structure s formed by the following operations. Firstly, a TSV opening is formed extending to the metal pattern in the M0 layer by one or more etching processes. After the TSV opening is formed, the liner is formed on sidewalls of the TSV opening to act as an isolation layer, such that the conductive material of the TSV and the substrate do not directly contact with each other. Afterwards, the diffusion barrier layer is conformally formed on the liner and on the bottom of the TSV opening. The diffusion barrier layer is used to prevent the conductive material, which will be formed later, from migrating to undesired regions. After the diffusion barrier layer is formed, the conductive material is used to fill into the TSV opening. Afterwards, excess liner, diffusion barrier layer, and conductive material, which are on the outside of the TSV opening, are removed by a planarization process, such as a chemical mechanical polishing (CMP) process, although any suitable removal process may be used.

At step 1006, a protection module (e.g., the antenna diode 136 shown in FIG. 4, the ESD protection module 136' shown in FIG. 5) is fabricated in the first substrate. The protection module is electrically connected to the TSV, and the protection module is within the TSV cell. At step 1008, a second IC die (e.g., the IC die 106 shown in FIG. 2) is provided at the back side of the first IC die and facing the first substrate.

At step 1010, the second IC die is bonded to the back side of the first IC die. The first IC die and the second IC die are electrically connected through the TSV. In one embodiment, the second IC die is bonded to the back side of the first IC die using hybrid bonding (i.e., by utilizing a HB structure), and the TSV is electrically connected to the HB structure.

In accordance with some disclosed embodiments, a 3D IC package is provided. The 3D IC package includes: a first IC die comprising a first substrate at a back side of the first IC die; a second IC die stacked at the back side of the first IC die and facing the first substrate; a TSV through the first substrate and electrically connecting the first IC die and the second IC die, the TSV having a TSV cell including a TSV cell boundary surrounding the TSV; and a protection module fabricated in the first substrate, wherein the protection module is electrically connected to the TSV, and the protection module is within the TSV cell.

In accordance with some disclosed embodiments, another 3D IC package is provided. The 3D IC package includes: a first IC die comprising a first substrate at a back side of the first IC die; a second IC die stacked at a front side of the first IC die; a HB structure bonding the first IC die and the second IC die, the HB structure having a HB region surrounding the HB structure; and a protection module fabricated in the first substrate, wherein the protection module is electrically connected to the HB structure, and the protection module is within the HB region.

In accordance with further disclosed embodiments, a method is provided. The method includes: providing a first IC die comprising a first substrate at a back side of the first IC die; fabricating a through-substrate via (TSV) through the first substrate, the TSV having a TSV cell; fabricating a protection module in the first substrate, wherein the protection module is electrically connected to the TSV, and the protection module is within the TSV cell; providing a second IC die at the back side of the first IC die and facing the first substrate; and connecting the second IC die to the back side of the first IC die using the TSV.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC) package, comprising:
    a first IC die comprising a first substrate at a back side of the first IC die;
    a second IC die stacked at the back side of the first IC die and facing the first substrate;
    a through-substrate via (TSV) through the first substrate and electrically connecting the first IC die and the second IC die, the TSV comprising a TSV cell having a TSV cell boundary surrounding the TSV; and
    a protection module fabricated in the first substrate, wherein the protection module is electrically connected to the TSV, wherein the protection module is fabricated within the TSV cell boundary surrounding the TSV, and wherein no functional cell is fabricated within the TSV cell boundary.

2. The 3D IC package of claim 1, wherein the protection module is an antenna protection module configured to provide antenna effect protection to the first IC die.

3. The 3D IC package of claim 2, wherein antenna protection module is an antenna diode.

4. The 3D IC package of claim 1, wherein the protection module is an electrostatic discharge (ESD) protection module configured to provide ESD protection to the first IC die.

5. The 3D IC package of claim 4, wherein the ESD protection module includes multiple diodes connected in parallel.

6. The 3D IC package of claim 4, wherein the ESD protection module is one of: a bipolar transistor, a metal-oxide-semiconductor field-effect transistor (MOSFET), and a silicon-controlled rectifier (SCR).

7. The 3D IC package of claim 1, wherein the TSV cell is a keep-out zone (KOZ) of the TSV.

8. The 3D IC package of claim 1, wherein the protection module is outside a TSV buffer zone of the TSV.

9. The 3D IC package of claim 1, wherein the TSV cell has a plurality of rows, and the protection module is placed on one of the plurality of rows.

10. The 3D IC package of claim 1, wherein the first IC die comprises a transistor in a functional cell, the transistor having an enlarged gate polysilicon area.

11. A three-dimensional (3D) integrated circuit (IC) package, comprising:
    a first IC die comprising a first substrate at a back side of the first IC die;
    a second IC die stacked at a front side of the first IC die;
    a hybrid bonding (HB) structure bonding the first IC die and the second IC die, the HB structure having a HB region surrounding the HB structure; and
    a protection module fabricated in the first substrate, wherein the protection module is electrically connected to the HB structure, and the protection module is fabricated within the HB region surrounding the HB structure, and wherein no functional cell is fabricated within the HB region.

12. The 3D IC package of claim 11, wherein the protection module is an antenna protection module configured to provide antenna effect protection to the first IC die.

13. The 3D IC package of claim 12, wherein antenna protection module is an antenna diode.

14. The 3D IC package of claim 11, wherein the protection module is an electrostatic discharge (ESD) protection module configured to provide ESD protection to the first IC die.

15. The 3D IC package of claim 14, wherein the ESD protection module includes multiple diodes connected in parallel.

16. The 3D IC package of claim 11, wherein the first IC die comprises a transistor in a functional cell, the transistor having an enlarged gate polysilicon area.

17. The 3D IC package of claim 11, wherein the protection module is electrically connected to the HB structure through a multi-layer interconnect (MLI) structure.

18. The 3D IC package of claim 17, wherein the HB structure comprises a HB metal layer and a HB contact structure, the HB contact structure electrically connecting the HB metal layer and the MLI structure.

19. A method, comprising:
    providing a first IC die comprising a first substrate at a back side of the first IC die;

fabricating a through-substrate via (TSV) through the first substrate, the TSV comprising a TSV cell having a TSV cell boundary surrounding the TSV;

fabricating a protection module in the first substrate, wherein the protection module is electrically connected to the TSV, wherein the protection module is within the TSV cell boundary surrounding the TSV, and wherein no functional cell is fabricated within the TSV cell boundary;

providing a second IC die at the back side of the first IC die and facing the first substrate; and bonding the second IC die to the back side of the first IC die, the first IC die and the second IC die being electrically connected through the TSV.

20. The method of claim 19, wherein the protection module is one of: an antenna protection module configured to provide antenna effect protection to the first IC die, and an electrostatic discharge (ESD) protection module configured to provide ESD protection to the first IC die.

* * * * *